United States Patent [19]
Wang et al.

[11] Patent Number: 5,490,895
[45] Date of Patent: Feb. 13, 1996

[54] CERAMIC ALUMINUM LAMINATE AND THERMALLY CONDUCTIVE ADHESIVE THEREFOR

[75] Inventors: Mansheng Wang; Bruce A. Given, both of San Diego, Calif.

[73] Assignee: TRW Inc., Redondo Beach, Calif.

[21] Appl. No.: 212,336

[22] Filed: Mar. 14, 1994

Related U.S. Application Data

[60] Continuation of Ser. No. 955,807, Oct. 2, 1992, abandoned, which is a division of Ser. No. 541,663, Jun. 21, 1990, Pat. No. 5,180,625, which is a continuation of Ser. No. 189,859, May 3, 1989, abandoned.

[51] Int. Cl.$^6$ ............................ B32B 27/38; B32B 31/20
[52] U.S. Cl. ............................ 156/286; 156/330
[58] Field of Search ........................ 156/286, 330; 428/414, 416, 457, 901, 702

[56] References Cited

U.S. PATENT DOCUMENTS

| | | | |
|---|---|---|---|
| 3,305,416 | 2/1967 | Kahon | 156/286 |
| 4,299,873 | 11/1981 | Ogihara | 428/901 |
| 4,524,238 | 6/1985 | Butt | 357/81 |
| 4,866,108 | 9/1989 | Vachun | 428/40 |

FOREIGN PATENT DOCUMENTS 2214650  9/1987  Japan .

OTHER PUBLICATIONS

Material Safety Data Sheet; U.S. Dept. of Labor; EP21AOHT–1; undated.

"MasterBond Polymer Adhesive EP21AOHT"; Technical Data Sheet; undated.

"Novolac"; Hawley's Condensed Chemical Dictionary; 11th Edition; Sax and Lewis, ed.; Van Nostrand and Reinhold; NY; undated; p. 840;

"Phenolic Resin Adhesives"; Handbook of Adhesives; Skeist, ed.; Nostrand Reinhold; NY; 1990; pp. 316–340.

"Epoxy Resin Adhesives"; Handbook of Adhesives; Skeist, ed.; Nostrand Reinhold; NY; 1990; pp. 347–358.

"Eccobond 45" Technical Bulletin; Emerson & Cuming; 1985.

"Master Bond Polymer Adhesive EP21TDCAOHT" Technical Data Sheet; undated.

*Primary Examiner*—Jenna L. Davis

[57] ABSTRACT

A 5½" by 5¾" flat ceramic board is bonded to an aluminum frame which serves as a heat sink. The bonding agent intermediate the board and the frame is thermally conductive and comprises an epoxy containing Master Bond EP21TDCAOHT. The formed laminate or bond is capable of withstanding repeated stresses occurring through thermal cycling in temperatures from −60 degrees centigrade to +125 degrees centigrade and vibration and humidity testing.

12 Claims, 1 Drawing Sheet

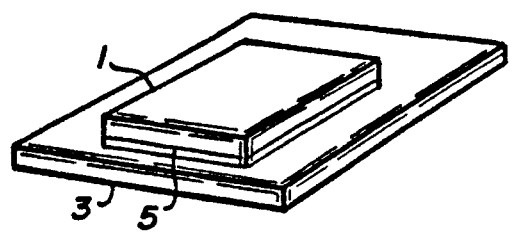
Fig_1
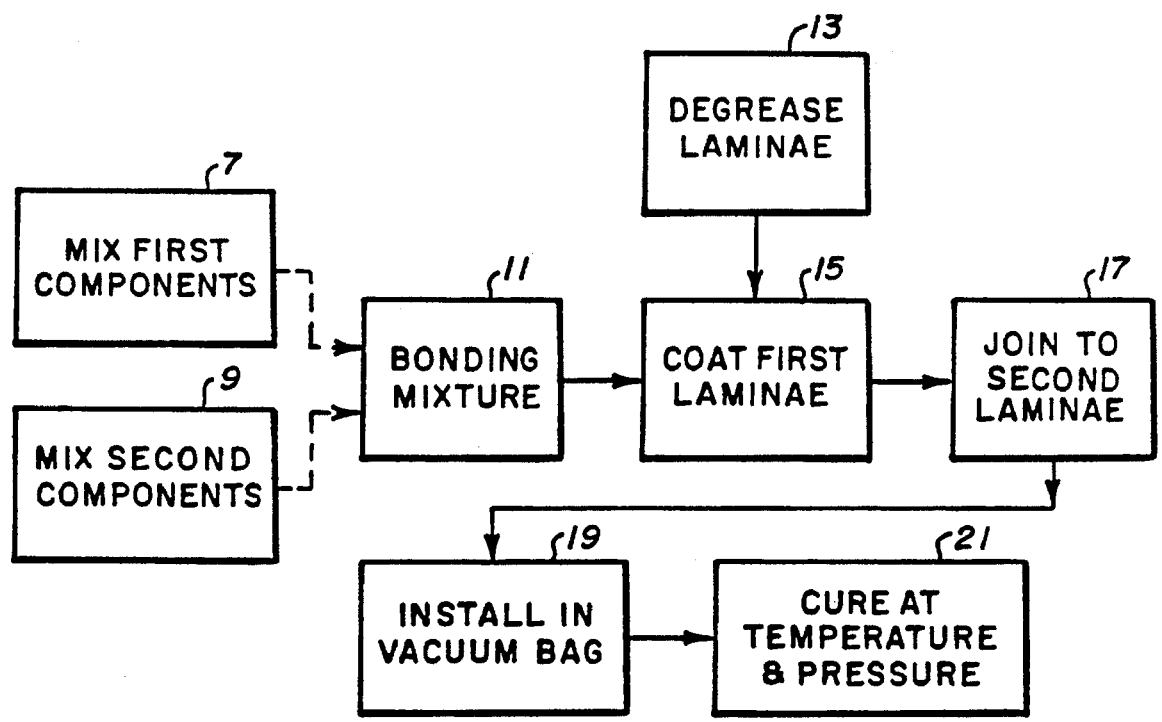
Fig_2

CERAMIC ALUMINUM LAMINATE AND THERMALLY CONDUCTIVE ADHESIVE THEREFOR

This is a continuation of U.S. patent application Ser. No. 07/955,807, filed Oct. 2, 1992, now abandoned, which is a divisional of U.S. Ser. No. 07/541,663, filed Jun. 21, 1990, now U.S. Pat. No. 5,180,623 entitled "Ceramic Aluminum Laminate and Thermally Conductive Adhesive Therefor" issued Jan. 19, 1993, which is a continuation application of Ser. No. 07/189,859, filed May 3, 1989, now abandoned.

FIELD OF THE INVENTION

This invention relates to a core bond between ceramic and aluminum materials whereby the aluminum is in thermally conductive relationship with the ceramic and serves as a "heat sink" for heat generated in the ceramic. The invention also relates to the formed ceramic aluminum laminate, the process of fabricating the laminate, and to a novel thermally conductive adhesive used in the process and laminate.

BACKGROUND

Ceramic packages are used to hold the semiconductor devices and associated circuits used in various electronic apparatus. The ceramic serves as a printed circuit board. In the operation of the semiconductor heat is generated by dissipation of electrical energy in the p-n junctions and, unless the heat is removed, the transistor temperature may rise to destructive levels. The heat must be transferred from the locale of the semiconductor to an external sink, referred to as a "heat sink", so as to prevent a build up of the temperature of the semiconductor, maintaining the semiconductor below the temperature at which destructive thermal runaway occurs.

One known material used as a heat sink is aluminum. The aluminum sheet is connected to the ceramic for the purpose of providing a thermally conductive passage. The large surface area of the aluminum sheet allows the heat to be conducted away to the ambient air or by additional thermally conductive connections to other cooling equipment. In the past the laminates formed of the ceramic board and the aluminum sheet used silicone as the bonding adhesive. Silicone provides an excellent bond between the ceramic and aluminum; one that is strong, is thermally conductive and is capable of meeting requirements of temperature cycling, vibration, humidity and resisted degradation when exposed to solvents, such as isopropyl and acetone, although some silicones degrade after a long term of exposure to MEK, 1,1,1 trichloroethane. However, the silicone adhesive has some disadvantage. Silicone generally requires a primer, such as ECCOSIL Primer S-11, which consists of 25% of polydimethyl Siloxane and 75% of VMP Naphtha to improve adhesion to non-silicone materials such as the ceramic and the aluminum. They require special manufacturing procedures to prevent contamination of the surrounding environment, such as vapor degreasers and surrounding materials such as solder paste; they require long curing times and "rework", the process of disassembling the laminate and then reassembling as might be required to repair a semiconductor within the ceramic package, is difficult and costly. Although substitutes such as adhesives available in the market place were tried, none appeared to be satisfactory with laminates of ten square inches or larger.

An object of the invention is to provide a silicone free substitute for the silicone bonding agent in a ceramic aluminum laminates. A further object of the invention is to provide a ceramic aluminum laminate in which the bonding agent does not contains silicones and possesses good thermal conductivity characteristics. A still further object of the invention is to provide a method of assembling a ceramic printed circuit board to an aluminum heat sink without the use of silicones using ingredients that are available on the market. An additional object of the invention is to provide a ceramic aluminum laminate structure of an area of ten square inches or greater that withstands temperature cycling over a range of −60 degrees centigrade to +125 degrees centigrade for at least 100 cycles, without breaking or bending. It is a still additional object of the invention to provide a thermally conductive adhesive to bond ceramic to aluminum and in which the bond is reworkable.

SUMMARY OF THE INVENTION

A laminate of greater than ten square inch area is formed of a ceramic board and an aluminum sheet by inclusion intermediate the board and sheet of an epoxy adhesive layer. The epoxy contains a polyamide hardener, an epoxy "Novolac" resin, a flow control agent, and fused alumina. A thermally conductive adhesive according to the invention is formed of a mixture containing Master Bond EP21TDCAOHT formed by mixing one part by weight of Master Bond EP21TDCAOHT and one part hardener by weight to form a first mixture element; mixing one part by weight "Eccobond 45" and one part by weight catalyst to form a second mixture element; and mixing one part by weight of said first element with one part by weight of said second element to form said adhesive mixture.

In the process a surface of a flat ceramic board is coated with at least a portion of said adhesive mixture to form a layer over that board surface, the board surface coated having an area greater than ten square inches, said layer being approximately 12 mils in thickness. The adhesive coated surface is placed in contact with the surface of an aluminum sheet to form an assembly. The assembly is then placed in a vacuum bag to maintain said elements of said assembly at a predetermined contact pressure and a predetermined temperature. That pressure and temperature are maintained for a predetermined time to cure said adhesive, resulting in the bonded ceramic board and aluminum layer.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DESCRIPTION OF THE DRAWINGS

In the drawings:

FIG. 1 illustrates a section view of a laminate according to the invention; and

FIG. 2 illustrates the method of forming the laminate according to the novel process.

DETAILED DESCRIPTION

The laminate illustrated in FIG. 1 is formed of a ceramic layer 1, suitably aluminum oxide, a layer of metal 3, suitably an aluminum sheet, and a layer of the bonding adhesive 5, discussed in detail hereinafter and which is silicone free. For convenience of illustration the layers are not illustrated to scale. Bonding layer 5 holds the laminate together and provides a thermally conductive path from the ceramic layer to the aluminum. The surface area of contact is greater than ten square inches.

By way of specific example, the ceramic layer measured approximately 5" by 5½" in length and width, which is over ten square inches in area, and was 0.055 inches in thickness, which is a relatively thin wafer. The aluminum layer covered a much larger area and was also fairly thin, measuring approximately 0.056 inches in thickness. As those skilled in the art appreciate the individual laminae or layers may be the same size and area or be of a different size and area, the latter of which is illustrated in the first figure.

Reference is made to FIG. 2, which shows an embodiment of the process. In this process a mixture of two adhesive mixtures are formed. The first element of the mixture was prepared by taking one part by weight of Master Bond EP21TDCAOHT and one part by weight of the hardener and mixing them as represented by block 7; then a portion of Eccobond 45 was taken in one part by weight and added to one part by weight of the Eccobond 45/Catalyst 15 and the elements were mixed as represented at 9; thereafter one part of the first element was taken and mixed with one part by weight of the second element to form the bonding agent or mixture, as variously termed, represented at 11.

Polymer adhesive Master Bond EP21TDCAOHT is an adhesive made available by Master Bond, Inc., a company located in Hackensack, N.J. That product is stated to generally contain the various known elements in the percentage by weight as follows: a pigment "grey" 5%; a catalyst "amine functional polybutadiene blend" 16%; a vehicle "liquid epoxy Novolac Resin" 16%; additives alumina fused 60%; and a flow control agent 3%; the exact details of which appears to be proprietary according to a material safety data sheet available from the U.S. Department of Labor OSHA and are not known to the applicants.

Eccobond 45 is a trade name for a bonding agent as made available by the Emerson and Cuming, Inc. Company of New Jersey. This is used in conjunction with Eccobond 45/Catalyst 15 to provide a medium viscosity room temperature curing epoxy system that has the capability of being rapidly cured at elevated temperatures according to the technical data sheet of that company.

It is recognized that a single adhesive or bonding agent may become available for use in the process and in the laminate construction, which is equivalent to the foregoing mixture. With such a substitute, the first two steps of the process described may be eliminated; the process would start as at block 11. For example, an adhesive having similar properties to the above described adhesive mixture is also available from the Master Bond Company as Part No. EP21AOHT-1. EP21AOHT-1 is an adhesive which includes 5% percent by weight of a gray pigment; 17% by weight of a polyamide hardener; 17% by weight of a liquid epoxy Novolac resin; 58% by weight of fused alumina; and by weight of a flow control agent.

The laminae are then degreased as represented at step 13. The ceramic board and the aluminum frame is treated with a vapor degreaser using FREON-TMS as degreasing agent to remove any grease. The surfaces are then treated with Isopropyl Alcohol to further clean those surfaces.

A thin layer approximately 12 mils in thickness of the adhesive bonding material mixture is then applied over a 5" by 5½" surface of the ceramic board, as represented by block 15. A spatula or rubber squeegee is useful for applying the adhesive. The board and the frame are then pressed together as at step 17 and the assembly is placed in a conventional vacuum bag, represented at 19, and the contact pressure between the board and frame applied in the vacuum bag is adjusted to five pounds per square inch. The environment is raised to a temperature of 121 degrees centigrade and the assembly is held at this temperature and contact pressure described for approximately forty-five minutes. This cures the adhesive mixture, as represented at block 21, and forms the laminate.

If desired the process may be modified by placing strips of KAPTON film around the periphery of the ceramic board. The film prevents the adhesive from spreading to that peripheral area when the two parts of the laminate are pressed together during assembly. Suitably the strips are on the order of 1/16th of an inch in width and 0.0105 inches thickness.

In this enhancement after the layer of adhesive is applied to the ceramic surface, the KAPTON films are removed to expose a bare portion providing a frame about the remainder of the resin layer. When the ceramic wafer is pressed against the aluminum sheet in the process described, the resin spreads out into this bare area. The use of the KAPTON films thus avoids including too much resin as might be forced to squirt out the sides of the laminate during the curing process.

It was discovered that the laminate so formed withstood thermal cycling, vibration and humidity testing to mil standard 810° C.; that is, the board temperature was raised to 125 degrees C. and then lowered to −60 degrees C. This process was repeated one-hundred times. The laminate withstood that cycling without breaking and/or permanently deforming. Further the assembly was found to have satisfactory thermal conduction properties; that is, the heat applied to the ceramic passed through the bonding agent to the aluminum sheet to a degree useful for semiconductor devices.

At the time of this discovery, the Master Bond EP21TDCAOHT adhesive was known to be of a thermally conductive characteristic. However, it was found to be too stiff and in the applicant's experiments that adhesive could not satisfactorily meet temperature cycling requirements between 60 degrees C. to 125 degrees C. Furthermore at the time Eccobond 45 material was known to be flexible but, however, was not thermally conductive. To applicant's surprise by combining the two elements, a thermally conductive bonding agent was created that withstands the required temperature cycling. The mechanisms or theory by which this combination of essentially dissimilar adhesives provides the discovered desirable result is not understood by the applicants, and may be studied by others who given this disclosure may open new doors in scientific exploration.

Given the discovery of the superior adhesive quality of the mixture of separate adhesives as described, "Master Bond EP21TDCAOHT" and "Eccobond 45" adhesives, a sample was given to the supplier of one of the adhesive components, Master Bond, Inc. accompanied by the description of favorable characteristics of that mixture. That organization then provided a variation to their existing adhesive, EP21AOHT, which is referred to by that company as Part No. EP21AOHT-1. That adhesive was then employed in the same process experiments earlier described.

It was determined that the substitution of this new adhesive EP21TDCAOHT within the laminate and the method provided performance that was roughly equivalent in all material respects, and had a higher thermal conductivity, one which measured 7 BTU inch per hour foot squared degrees Fahrenheit. A comparison of the physical properties of the two materials for the bonding agent mixture are as follows:

|  | EP21 AOHT-1 | ORIGINAL MIXTURE |
|---|---|---|
| 1) Specific Gravity (gms/cc) | 2.2 | 1.63 |
| 2) Viscosity @ 75° F. (cps) | 49,200 | 37,000 |
| 3) Working life after mixing @ 75° F. (hrs) | 3 | 3 |
| 4) Hardness, Shore A | 80 | 70 |
| 5) Volume Resistivity @ 75° F. (ohm-cm) | $10^{14}$ | $3 \times 10^{13}$ |
| 6) Dielectric Strength (volts/mil) | 410 | 400 |
| 7) Dielectric Constant @ 1 MH$_z$ | 3.2 | 3.1 |
| 8) Dissipation Factor @ 1 MH$_z$ | 0.040 | 0.035 |
| 9) Thermal Conductivity, (BTU-in/hr. ft.$^2$ °F.) | 7 | 3 |
| 10) Coefficient of Thermal Expansion (per °F.) | $68 \times 10^{-6}$ | $73 \times 10^{-6}$ |
| 11) Young's Modules, Tensile (psi) | 300,000 | 290,000 |
| 12) Tensile Strength (psi) | 5800 | 6100 |
| 13) Tensile Elongation (%) | 2.8 | 4.3 |
| 14) Tensile Lap Shear Strength (psi) | | |
| @ 75° F. | 3120 | 2970 |
| @ −75° F. | 2893 | 2655 |
| 15) Solvent Resistance, IPA, Freon (Hardness Measurement) | — | No difference |

Generally thermal stresses are unavoidable as a result of the fabrication of composite laminate. This is caused by a temperature change on the order of 100 degrees or so; between the high curing temperatures usually used for curing the adhesive that bonds the layers of the laminate together and room temperature. Since a laminate is fabricated so that it acts as a single layer of material, thermal stresses are naturally internally induced because the individual laminae are linked together mechanically and are not free to separately expand or contract as the temperature changes. Thus each laminae influences the expansion or contraction of the other because their coefficients of thermal expansion are different.

Commercially available thermally conductive epoxies, which generally were incorporated with metal oxides or other fillers, worked satisfactorily in applications requiring a bond between the electronic components or parts to the printed circuit board, such as the ceramic board. However, these kinds of epoxy adhesives did not survive thermal cycling tests if the bonding area was large, that is, larger than 10 square inches, if other parameters affecting the magnitude of thermal stresses, such as Young's Modules and the Shear Modulus were not considered at the time the adhesives were formulated.

The thickness as well as several inherent physical properties of adhesive, such as Young's Modulus, Shear Modulus, Poisson Ratio, and Linear coefficient of thermal expansion, affect the level of induced thermal stress. One value of this invention was to evaluate those factors and introduce a flexible thermally conductive epoxy to bond ceramic printed wiring board to an aluminum frame that survived various kinds of environment tests elsewhere herein specified.

The laminae and the process disclosed appears to satisfy the need for bonded ceramic aluminum laminae in the range of ten square inches and greater. The board is reworkable. That is, the bond may be loosened by the use of appropriate solvent chemicals without damaging the aluminum or ceramic. The two laminae may then be reprocessed and formed again into a unitary assembly.

It is believed that the foregoing description of the preferred embodiment of the invention is sufficient in detail to enable one skilled in the art to make and use the invention. However, it is expressly understood that the details of the elements which are presented for the foregoing enabling purpose is not intended to limit the scope of the invention, in as much as equivalents to those elements and other modifications thereof, all of which come within the scope of the invention, become apparent to those skilled in the art upon reading this specification. Thus the invention is to be broadly construed within the full scope of the appended claims.

What is claimed is:

1. A method of heat sinking a ceramic circuit board having a surface of an area of ten square inches or greater to an aluminum sheet to form a heat sinked ceramic circuit board assembly capable of withstanding repeated temperature cycling between −60 degrees C. and +125 degrees C. without breaking or permanent deformation, said method comprising the steps of:

forming an adhesive mixture with said mixture being thermally conductive and having a dielectric constant of at least 3 when measured at 1 MHz, wherein the step of forming the adhesive mixture comprises the steps of:

mixing one part by weight of a first adhesive comprising an amine functional polybutadiene blend, a liquid epoxy Novolac resin, alumina, and a flow control agent and one part hardener to form a first mixture element;

mixing one part by weight of a second adhesive and one part catalyst to form a second mixture element, said second mixing element being a medium viscosity, room temperature curing system capable of being rapidly cured at elevated temperatures; and mixing one part by weight of said first mixture element with one part by weight of said second mixture element to form said adhesive mixture;

coating said adhesive mixture over at least a portion of said surface of said ceramic circuit board to form a covering layer thereon;

placing an aluminum sheet in contact with the adhesive coated surface of said ceramic circuit board, said aluminum sheet having a surface geometry and area at least as great as said surface of the ceramic board so as to cover said adhesive coated surface of said ceramic circuit board; and placing the ceramic circuit board and aluminum sheet in a vacuum to maintain the elements thereof at a predetermined contact pressure and a predetermined temperature and maintaining said ambient conditions for a predetermined time to cure said adhesive mixture and form the heat sinked ceramic circuit board assembly.

2. The method as defined in claim 1 wherein said predetermined contact pressure maintained in said vacuum bag is five pounds per square inch; said predetermined temperature is approximately 121° C.; and said predetermined time is approximately 45 minutes.

3. The method as defined in claim 1 wherein said adhesive mixture possesses the following characteristics after th adhesive mixture has been cured by the step of placing the laminate assembly in the vacuum: Hardness, Shore A, of about 70; Volume Resistivity @75%F (ohm-cm) of about $3 \times 10^{13}$; Dielectric Strength (volts/mil) of about 400; Dielectric Constant @1 MHz of about 3.1; Dissipation Factor @ 1

MHz of about 0.035; Thermal Conductivity (BTU-in/hr. ft.$_2$° F.) of about 3: Coefficient of Thermal Expansion (per °F.) of about .73×10$^{-6}$; and Young's Modulus, Tensile (psi) of about 290,000.

4. The method as defined in claim 1 further comprising prior to the step of coating said ceramic circuit board, the step of vapor degreasing said ceramic circuit board by treating said ceramic circuit board with a vapor degreaser.

5. The method of claim 4 further including the step of applying isoprophy alcohol to said surface of said ceramic circuit board to further clean said ceramic circuit board subsequent to said step of vapor degreasing.

6. A method of heat sinking a ceramic circuit board such that the circuit board is capable of withstanding repeated temperature cycling between −60° C. and 125° C. without breaking or permanent deformation, said method comprising the steps of:

provewing an adhesive mixture, said adhesive mixture including by weight, approximately 17% of a polyamide hardener, approximately 17% of a liquid epoxy Novolac resin, approximately 58% of fused alumina, and approximately 4% of a flow control agent;

coating the adhesive mixture over a surface of the ceramic circuit board;

placing the adhesive coated surface of the ceramic circuit board in contact with a surface of a sheet of aluminum, said sheet of aluminum having an area at least as great as the portion of the ceramic board surface coated with the adhesive mixture; and placing the ceramic circuit board and the sheet of aluminum in a vacuum for a predetermined period of time to maintain the ceramic circuit board and the sheet of aluminum at a predetermined pressure and a predetermined temperature in order to cure the adhesive mixture.

7. The method according to claim 6 wherein the adhesive mixture has the following characteristics after the step of curing: a hardness, shore A, of about 80; a volume resistivity at 75° F. of about 1×10$^{14}$ ohm-cm; a dielectric strength of about 410 volts/mil, a dielectric constant at 1 MHz of about 3.2; a dissipation factor at 1 MHz of about 0.040; a thermal conductivity of about 7 BTU in/hr. ft.$^2$° F.; a coefficient of thermal expansion (per °F.) of about 68×10$^{-6}$; a Young's Modulus, tensile of about 300,000 psi; a tensile strength of about 5800 psi; a tensile elongation of about 2.8%; and a tensile lap shear strength at 75° F. of about 3120 psi and at − 75° F. of about 2893 psi.

8. The method according to claim 6 further comprising the step of vapor degreasing the ceramic circuit board by treating the ceramic circuit board with a vapor degreaser prior to the step of coating the ceramic board with the adhesive mixture.

9. The method according to claim 8 further comprising the step of applying isopropyl alcohol to the surface of the ceramic circuit board to further clean the ceramic circuit board subsequent to the step of vapor degreasing.

10. The method according to claim 6 wherein the predetermined contact pressure is approximately five pounds per square inch, the predetermined temperature is approximately 121° C., and the predetermined time is approximately 45 minutes.

11. The method according to claim 6 wherein the coated portion of the surface of the circuit board is approximately 10 square inches or greater.

12. The method according to claim 6 wherein the adhesive mixture includes 4% of a gray pigment by weight.

\* \* \* \* \*